United States Patent [19]

Kenney

[11] Patent Number: 5,254,503
[45] Date of Patent: Oct. 19, 1993

[54] PROCESS OF MAKING AND USING MICRO MASK

[75] Inventor: Donald M. Kenney, Shelburne, Vt.

[73] Assignee: International Business Machines Corporation, Armonk, N.Y.

[21] Appl. No.: 892,081

[22] Filed: Jun. 2, 1992

[51] Int. Cl.⁵ .......................................... H01L 21/308
[52] U.S. Cl. .................................. 437/228; 437/233; 437/235; 437/238; 437/977; 437/919; 437/52
[58] Field of Search ...................... 437/65, 66, 67, 68, 437/228, 977, 919, 977, 233, 235, 238; 148/DIG. 51, DIG. 14, DIG. 138

[56] References Cited

FOREIGN PATENT DOCUMENTS

| | | |
|---|---|---|
| 61-3489 | 1/1986 | Japan . |
| 61-189503 | 8/1986 | Japan . |
| 1-35917 | 2/1989 | Japan . |
| 1-135018 | 5/1989 | Japan . |
| 2-58827 | 2/1990 | Japan . |
| 3-257825 | 11/1991 | Japan . |

Primary Examiner—George Fourson
Attorney, Agent, or Firm—Howard J. Walter, Jr.

[57] ABSTRACT

A method is provided to enable the formation of sub-lithographic relief images to increase the surface area of semiconductor structures for use in the storage nodes of DRAM cells. The method includes the steps of forming in situ a non-planar region having a relief pattern comprising sub-micron sized elements and the transferring the relief pattern into a masking layer in order to selectively etch a substrate to form relatively deep trenches having a density equal to the relief pattern. Polysilicon and porous silicon can be used to form the sub-micron relief pattern.

9 Claims, 2 Drawing Sheets

PROCESS OF MAKING AND USING MICRO MASK

BACKGROUND OF THE INVENTION

1. Field of the Invention

This invention relates to methods of forming sublithographic patterns in semiconductor processing technologies and more particularly to methods of increasing the surface area of structures used as capacitors or other area dependent structures.

2. Description of the prior art

The development of the semiconductor industry has always followed that of the Dynamic Random Access Memory (DRAM) technology in that the DRAM development has led in the use of the highest density technology elements capable of being produced in manufacturable quantities. The development of DRAM's in the 4 Megabit (4 Mb) density range began to depart from the twenty year tradition of two-dimensional DRAM designs by the appearance of three-dimensional DRAM cell structures, most notably by the use of trench capacitors. Proposed designs for DRAM cells in the 16 Mb, 64 Mb and higher density range have also included the use of multi-plate or stacked storage capacitor cell designs, see for example the article "3-Dimensional Stacked Capacitor Cell for 16M and 64M DRAMS," by T. Ema et al., International Electron Device Meeting (IEDM), December 11-14, 1988, pp. 592-5, for a description of stacked DRAM cells.

Although the use of stacked cell technology has rendered the processing of DRAMs more complex, such techniques continue to be used extensively, as suggested by the article "A Novel Stacked Capacitor Cell with Dual Plate for 64 Mb DRAMS," by H. Arima et al., 1990 IEDM, paper 27.2, Dec. 9-12, 1990, pp. 651-4.

Although the preceding designers of DRAMs had taken satisfaction in designing DRAMs using the available microlithographic ground rules available to them, designers of 64 Mb DRAMs realized that they would be required to go far beyond the minimum ground rules of about 0.4 micron in order to provide capacitors of sufficient area to meet the requirements of 64 Mb DRAMS. As a result, there have been described several techniques for providing structures including sub-lithographic elements in order to enhance the surface area and, thus, the capacitance of DRAM capacitors by texturing or roughening the surface of polysilicon electrodes used as capacitor plates. For example, M. Sakao et al. describe in their paper at the 1990 IEDM, paper 27.3, pp. 655-8, how deposition of polysilicon at about 550 degrees C. yields hemispherical-shaped grains of polysilicon about 80 nm in diameter. Thus, surface irregularities in the order of about one-fifth that of the minimum definable feature are formed providing a potential doubling in capacitance per unit area in the plane of the substrate. These surface irregularities can be transferred to the surface of an underlying polysilicon layer by Reaction Ion Etching (RIE). Others, including M. Yoshimaru et al in their 1990 IEDM paper 27.4, December 9-12, pp. 659-662, have shown that cylindrical polysilicon grains can be deposited having greater influence on the capacitance per unit surface area.

Surface roughness can be achieved by several methods. For example, partially oxidizing p+ polysilicon conductors leads to enhanced grain size as described in any of the following references: U.S. Pat. No. 4,119,995 to Siako on Oct. 10, 1978 describes a polysilicon roughening method in which wet oxidation and subsequent removal of oxide is used to promote the electrical discharge of a floating gate in a nonvolatile memory device. U.S. Pat. No. 4,314,265 to Simko describes the grain sizes in the range of about 450 Angstroms in width by about 750 Angstroms in height. This surface irregularity being substantially similar to the grain size described by Sakao et al. above. The article by P. C. Fazen et al. describes the preferable use of silicon nitride layer adjacent to roughened polysilicon for capacitors requiring low leakage.

In addition, the roughening of the surface of polysilicon by the use of an anodic process has also been reported by Sandhu in U.S. Pat. No. 5,068,199 issued Nov. 26, 1991.

Porous silicon can be formed in monocrystalline silicon substrates to provide surface connected pores several times deeper that those of roughened silicon though the use of anodization in the presence of hydrofluoric acid, see the articles "Microstructure and formation mechanism of porous silicon," by M. I. J. Beale, et al., Applied Physics letters, Jan. 1, 1985, p 86-88, and "Selective porous silicon formation in buried P+ layers," by S. S. Tasco, et al., J. Applied Physics 62(10), Nov. 15, 1987. The porous silicon produced by this anodic process is somewhat similar to the process described above by Simko in that the oxidation process is enhanced along the polycrystalline grain boundaries.

Yet another method has been proposed to provide enhanced surface roughness by T. Mine et al. in the article "Capacitance-Enhanced Stacked-Capacitor with Engraved Storage Electrode for Deep Submicron DRAMS," 21st Conference on Solid State Devices a nd Materials, Tokyo, 1989, pp. 137-140. Here, particles of photo resist generated from an unidentified source are suspended in a spin on glass (SOG) film. The SOG is etched selective to the photoresist in order to leave resist particles on the surface of a polysilicon layer. After removal of the SOG, the underlying polysilicon is etched in the presence of the resist particles. While such a technique has potential for eclipsing those using surface roughening alone, it suffers from lack of a manufacturable method. In addition, because particulate sedimentation is relied on, insufficient randomness in distribution of the particles can occur.

While the prior art techniques have addressed the problem of increased capacitance, only minor success has been achieved. The subject invention is directed toward methods for significantly increasing the surface area and the effective capacitance of a given storage plate configuration.

SUMMARY OF THE INVENTION

It is an object of this invention to provide enhanced surface area and increased capacitance for such applications as may be required.

Another object is to provide a method capable of providing significant variability in degree of roughness and which is not limited to in situ roughness.

The present invention is achieved by the following process sequence. In order to extend the surface topography beyond the surface itself, the surface is utilized merely to establish a reference mask structure which is used to etch the underlying surface to a desired depth in order to provide substantial increases in capacitance. This is achieved by the formation of an inherent nonplanarity in the surface of a first material; using the relief pattern to form at least a partial mask layer over the surface of the substrate; selectively removing portions of the masking layer in order to expose portions of the first material; and directionally etching the first material through the exposed portions in the mask layer. The invention includes alternative process sequences for forming the mask. In a first alternative an etch resistant mask is formed by the relief structure itself while in a second alternative, the relief structure is used to define an underlying masking layer.

These and other objects of the invention will become more apparent from the several drawings and description of the preferred embodiment.

DESCRIPTION OF THE PREFERRED EMBODIMENT

Figure 1:
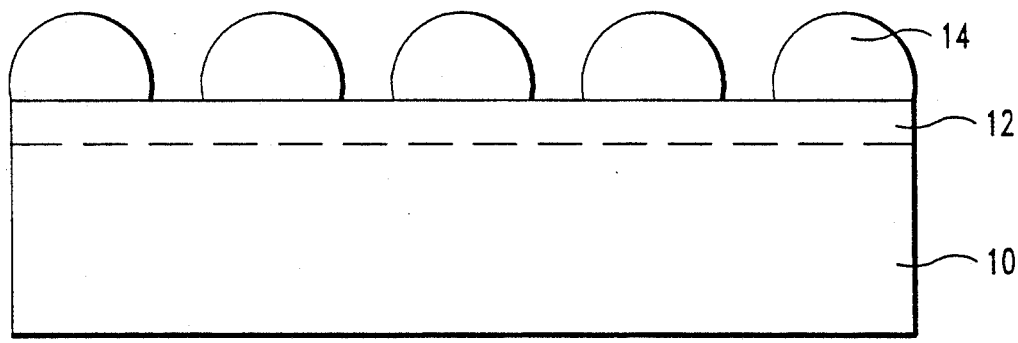
FIG. 1 is a simplified schematic view of a substrate in which the uppermost portion has been made irregular by the presence of a relief pattern formed on its upper surface.

Referring to FIG. 1 there is shown a substrate 10 which may be of any desired material, but is preferably a semiconductor substrate, which may be monocrystalline or polycrystalline in form. At the upper surface of the substrate there is a region 12 which may be of the same or a different material than the substrate, as will be further explained below. The upper surface 14 of region 12 is non-planar and includes irregularities in its surface in the sub-micron (tens to hundreds of Angstrom units) range as a result of a previous process such as described in the prior art section above. The non-planarity of surface 14 can be caused by any of the grain size roughening techniques using anodic processes described by the prior art, all of which is hereby specifically incorporated by reference.

As taught by the prior art, the roughness caused by the processes can be controlled to provide granularity in the range of about 500 Angstrom units. For example, polysilicon can be deposited from the decomposition of silane SiH4 in a hot wall vertical LPCVD reactor, at a pressure of about 0.2 Torr and a temperature of about 560 degrees C. to produce hemispherical shaped grains having a diameter of about 800 Angstrom units. Using a temperature of 565 degrees leads to cylindrical grains. Caution must be used to carefully control temperature of the reactor during deposition since deposited films can become amorphous if the temperature falls to about 550 degrees C.

The non-planarity or relief structure of region 14 can also be formed by the use of a porous silicon technique in which case the irregularities become vertically oriented, tree-like pores terminating at the surface of the region. If porous silicon is to be used to create the irregularities in surface 14, then region 12 is preferred to be monocrystalline for best results. The size of pores formed by this method range from tens of Angstroms units to hundreds of Angstrom units and can be selected as a function of impurity doping concentration level of either n-type or p-type impurity, as more specifically described by Beale et al., cited above.

Figure 2:
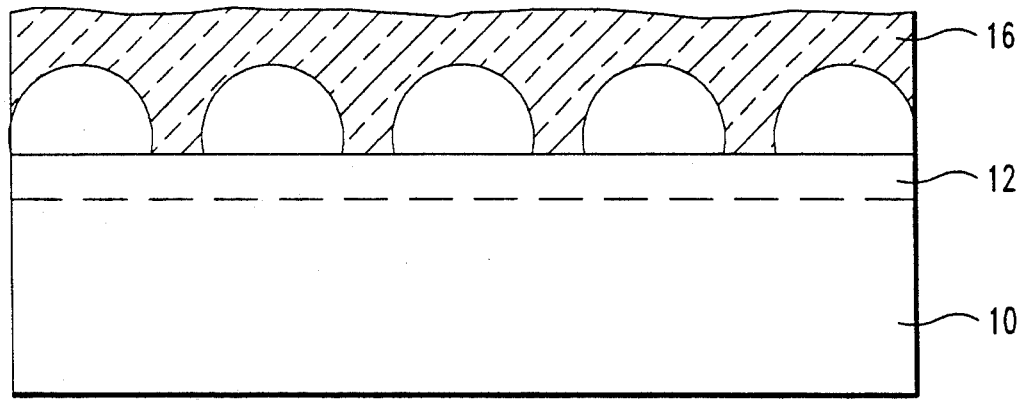
FIG. 2 is another view of the substrate illustrating the presence of a mask forming material.

After creating the sub-micron, Angstrom unit range surface irregularities, a layer 16 of masking material, as shown in FIG. 2, is applied over surface 14 to at least partially fill in the recesses in the surface 14. Masking layer 16 must be capable of being selectively removed in the presence of the material in region 12. When the substrate and region 12 are silicon, the mask material of layer 16 is preferred to be silicon dioxide and can be deposited by any of a number of methods including CVD, SOG, or thermal oxidation.

Figure 3:
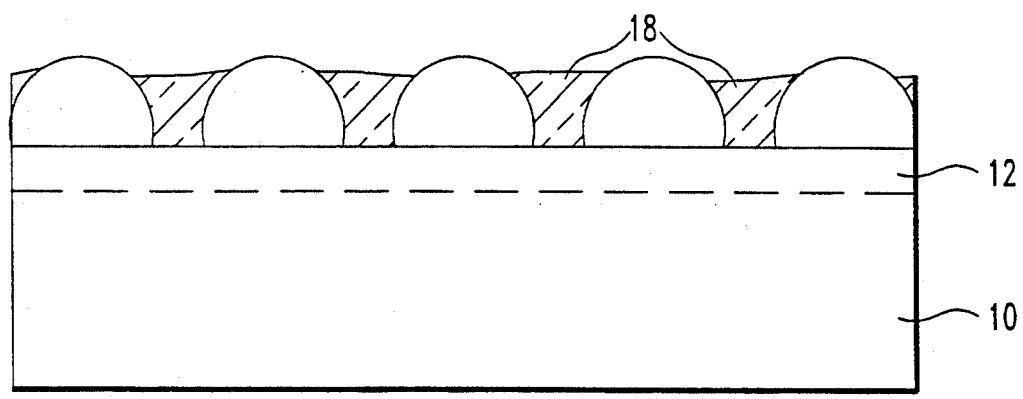
FIG. 3 illustrates the process of the invention after the mask forming material has been selectively etched back to partially expose the surface of the substrate.

Following the deposition of masking layer 16, an etchant capable of etching layer 16 is used to remove at least portions of the masking layer 16 sufficient to expose the uppermost portions of surface 14 leaving remaining portions 18 in the lowermost portions of surface 14, as shown in FIG. 3. At this point in the process several options exist since two sub-lithographic patterns now exist on the surface of the substrate. One mask pattern comprises the remaining portions 18 of the masking layer 16 while the other comprises its complement, depending upon which material is selectively removed in the next sequential process step.

Figure 4:
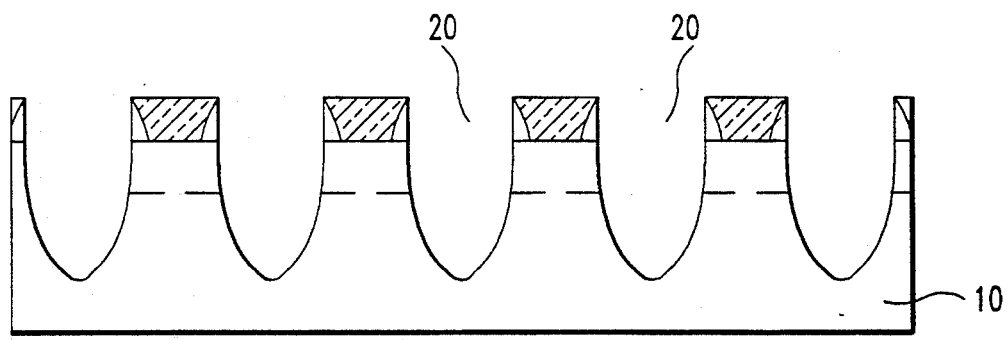
FIG. 4 illustrates the process of the invention following the use of a directional etch step to remove portions of the substrate where not covered by the mask.

FIG. 4 illustrates the results when an etchant having a selectivity to silicon is used to etch minute trenches into the substrate 10. If the etching process has an oxide to silicon etch ratio of about 15:1 then trenches 20 can easily be formed to a depth of 0.3 to 1.0 micron when the thickness of masking oxide layers 18 are on the order of 0.020 micron, or only 200 Angstrom units thick.

Following the transfer of the masked pattern into the substrate, the mask forming layers can be removed and the substrate further processed as necessary.

An alternative process can be provided if region 12 of the substrate is itself selectively etchable with respect to the substrate 10. In such a case, the initial roughened or textured surface can be used directly as a mask with respect to the underlying layer 12. If region 12 is formed of an oxide, for example, the selective etching of the oxide would provide a masking pattern.

Figure 5:
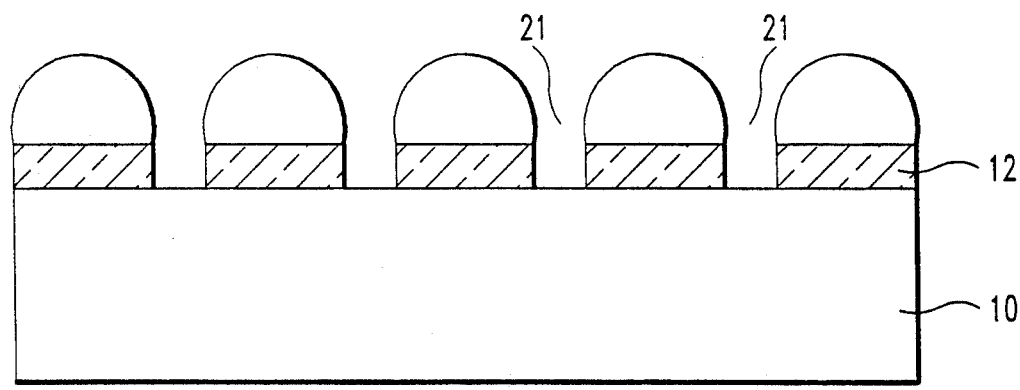
FIG. 5 is a schematic view of an alternative embodiment of the invention in which the relief structure of the substrate is used to form a mask in an underlying layer.

In this case, the mask layer is provided before the non-planar surface is created and is defined by the etching in the presence of the irregular surface 14. FIG. 5 is illustrative of the results of such a process in which the masking layer 12 is formed of silicon dioxide and the irregular relief surface pattern comprising surface 14 is used to directly define the regions in which patterns are to be retained.

In will be recognized that the dimensions of the sub-lithographic masking segments formed in the above process are determined by the nature of the deposition process which is used to deposit the nucleation material. The subsequent etching of the surface of the substrate in the presence of the masking material provides for substantial increases in surface area far beyond that achievable by surface roughening alone. The in situ formation of the masking segment defining portions is also possible since the process does not rely on the remote generation of image segments which would have to be transferred to the surface of the substrate and then uniformly distributed.

Figure 6:
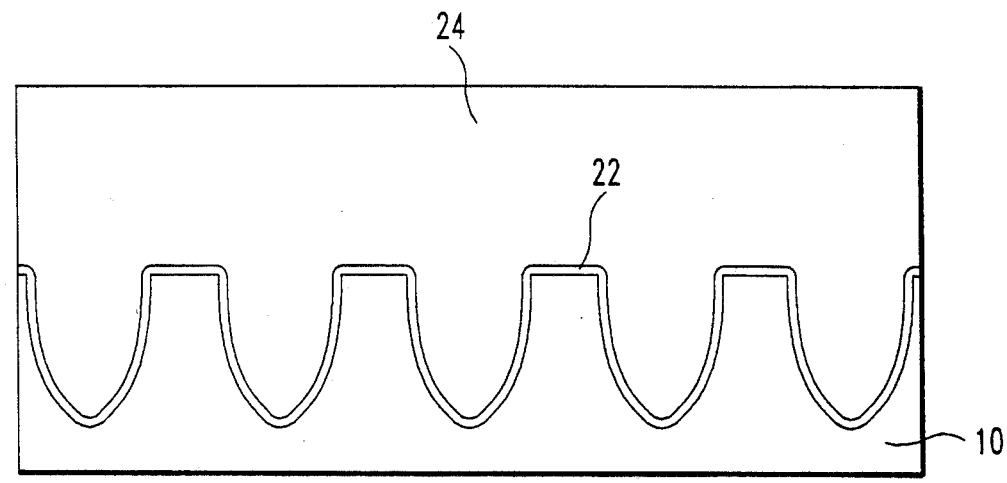
FIG. 6 is a schematic view of the enhanced roughness of the substrate further processed to form a capacitor.

Following the formation of the sub-lithographic patterns in the substrate, the increased surface area presented may be utilized to form a capacitor of enhanced capacitance by the conformal deposition of a suitable dielectric layer 22, such as silicon dioxide, silicon nitride, tantalum dioxide and combinations thereof, followed by a layer of a conductive material 24 such as polysilicon, as shown in FIG. 6.

Although the invention has been illustrated by the use of polysilicon to form the necessary sub-lithographic structures, it will be clear to those skilled in the art that other materials capable of providing sub-lithographic dimensioned structures in the sub-micron range can also be used. For example, porous silicon can also be used where the substrate is monocrystalline.

While the invention has been described in terms of specific embodiments, those skilled in the art will recognize that there exist a multitude of variations which can be expected to provide substantially similar results.

What is claimed is:

1. The method of forming regular sub-lithographic patterns in the range of hundreds to thousands of Angstrom units in dimension comprising the steps of:
   forming as a part of the surface of a substrate a non-planar region including a relief pattern having irregularities in its surface, the irregularities having dimensions of about 20 to 1000 Angstrom units;
   forming a masking pattern on said non-planar region using said relief pattern to determine the configuration thereof; and
   using the masking pattern to etch substantially vertical trench regions into said substrate.

2. The method of claim 1 wherein the step of forming the masking pattern includes the sub-steps of depositing a layer of material, selectively etchable with respect to the substrate, over the relief pattern formed on the substrate; and selectively removing portions of the thickness of said selectively etchable material to expose at least the upper portion of said relief pattern.

3. The method of claim 2 wherein the selectively etchable material comprises an oxide.

4. The method of claim 3 wherein the selectively etchable material is silicon dioxide.

5. The method of forming regular sublithographic patterns in the range of hundreds to thousands of angstrom units in dimension comprising the steps of:
   forming on the surface of a substrate a non-planar region including a relief pattern having dimensions of about 20–1000 angstrom units;
   forming a masking pattern using said relief pattern to determine the configuration thereof; and
   using the masking pattern to etch substantially vertical trench regions into the substrate, wherein the step of forming the masking pattern includes the step of forming a masking layer on the surface of the substrate prior to the formation of the non-planar region and wherein the formation of the non-planar region includes deposition of polycrystalline silicon.

6. The method of claim 5 wherein the deposition proceeds at a temperature between 550 and 570 degrees Centigrade.

7. The method of claim 1 wherein the substrate is silicon.

8. The method of claim 5 wherein the sub-lithographic relief patterns are formed of polysilicon formed in hemispherical grain structures.

9. The method of claim 1 wherein the non-planar region is at least partially formed of porous silicon.

* * * * *